United States Patent [19]

Brunius

[11] Patent Number: 4,864,636

[45] Date of Patent: Sep. 5, 1989

[54] CRYSTAL CONTROLLED TRANSMITTER

[76] Inventor: Robert E. Brunius, 905 Cottage Ave. E., St. Paul, Minn. 55106

[21] Appl. No.: 16,561

[22] Filed: Feb. 19, 1987

[51] Int. Cl.[4] .............................................. H04B 1/03
[52] U.S. Cl. ...................................... 455/118; 331/76;
  331/116 R; 340/870.3; 340/825.62; 455/119;
  455/129; 343/702
[58] Field of Search ............. 332/31 R, 31 T; 331/76,
  331/116 R, 116 FE, 158; 340/825.62, 825.64,
  696, 870.3; 343/702, 904, 906; 455/91, 95, 118,
  119, 129; 375/23, 59, 68, 71, 73; 370/10

[56] References Cited

U.S. PATENT DOCUMENTS

| | | | |
|---|---|---|---|
| 2,884,526 | 4/1959 | Cortese | 331/116 R |
| 3,108,223 | 10/1963 | Hunter | 455/118 |
| 3,311,812 | 3/1967 | Geiszler et al. | 455/91 |
| 3,742,496 | 6/1973 | Jezo | 455/118 |
| 4,384,288 | 5/1983 | Walton | 340/825.64 |
| 4,591,863 | 5/1986 | Patsiokas | 343/702 |
| 4,635,296 | 1/1987 | Dinsmore | 455/119 |
| 4,641,366 | 2/1987 | Yokoyama et al. | 343/702 |

Primary Examiner—Benedict V. Safourek
Attorney, Agent, or Firm—Douglas L. Tschida

[57] ABSTRACT

A short distance, battery powered, amplitude modulated, crystal controlled RF transmitter for transmitting encoded security information. In its preferred embodiments, the transmitter comprises a novel fifth overtone crystal oscillator which self-produces a carrier frequency at the third harmonic of the fifth overtone of the crystal's fundamental frequency, which carrier frequency is coupled by a series resonant trap, or a pi network, tuned to the carrier frequency to an amplifier stage where the carrier is amplitude modulated via pulse position encoded binary security data. In an alternative embodiment, the transmitter comprises matched crystal oscillator, tripler and amplifier stages. Also disclosed is an antenna including a battery clip contact.

7 Claims, 4 Drawing Sheets

CRYSTAL CONTROLLED TRANSMITTER

BACKGROUND OF THE INVENTION

The present invention relates to telemetered security systems and, in particular, to a crystal controlled transmitter for transmitting pulse position encoded binary data from distributed system sensors, user input units or a system controller or central processing unit (CPU).

With increasing amounts of radio frequency transmissions, as well as emissions from various electronic equipment, over the years regulations have been developed in the U.S. and abroad for various classes of such equipment to establish acceptable radiation limits and broadcast ranges. For example, the European communities require the use of a crystal oscillator; whereas, the Federal Communications Commission in the United States has established definitive emission standards which must be met before a circuit may be released to market.

Although crystal oscillators provide frequency stability, by themselves they are not capable of operating at the required frequencies for the present application (i.e. 319.5 MHz), nor necessarily within the permitted emission limits. In designing such transmitters, it is also common practice to couple a lower frequency stage to one or more multiplier stages and/or amplifier stages to develop a desired carrier frequency. Appropriate modulation stages, in turn, are coupled as needed to the oscillator or amplifier stages. However, the resultant transmitter may still not meet applicable regulations, nor the present packaging goals.

One example Applicant is aware of where a crystal oscillator is used in a security system can be found in U.S. Pat. No. 3,848,231. There a crystal controlled transmitter of undisclosed construction is described which operates to transmit pulse position encoded messages of variable duration data frames and pulse widths, as opposed to the present fixed duration data frames and pulse widths. The crystal oscillator also operates to produce a frequency modulated output signal, whereas the present transmitter produces an amplitude modulated output.

Another reference Applicant is aware of is U.S. Pat. No. 4,581,606, which discloses a programmable sensor transmitter producing frequency shift key modulated signals that are transmitted by a 300 MHz transmitter. Again, though, no mention is made of the construction of the detailed transmitter or oscillator circuitry.

SUMMARY OF THE INVENTION

It is accordingly a primary object of the invention to provide for crystal controlled RF transmitter circuitry producing a stable, narrow band frequency output without undue emissions so as to accommodate applicable regulations.

It is another object to provide a crystal overtone oscillator circuit which is capable of self-producing a desired harmonic carrier frequency, specifically the third harmonic, from fifth overtone oscillations.

It is another object to provide circuitry which may be compactly packaged to permit inconspicuous mounting in relation to a security transducer, which may also be incorporated therein.

It is a still further object of the invention to provide a novel antenna design for use in conjunction with such a transmitter and wherein a necessary battery clip terminal is integrated into the antenna design.

These and various other objects and advantages are achieved by way of a variety of alternative embodiments of the present crystal controlled transmitter which is responsive to pulse position encoded binary messages to produce an amplitude modulated RF output at a 319.5 MHz carrier frequency.

In its preferred construction, the transmitter includes a novel fifth overtone 106.5 MHz crystal controlled oscillator which directly produces and enriches its own third harmonic at 319.5 MHz so as to eliminate the need for a discrete tripler stage. An intermediate series resonant trap or pi coupling network couples the carrier to an amplifier output stage. Encoded binary input data, in turn, is coupled to the amplifier stage to amplitude modulate the carrier frequency which is transmitted by way of an improved antenna to the system controller or CPU.

In an alternative embodiment, fifth overtone oscillator, tripler and amplifier stages are serially coupled to one another.

The transmitter antenna has been particularly improved by forming it of a resilient spring material and shaping its one end as a battery clip. The circuitry part count is thereby reduced without affecting performance.

The above objects, advantages and distinctions, as well as others, along with the detailed construction of the invention, will be described in detail hereinafter with respect to the appended drawings. Before referring thereto, though, it is to be appreciated that the following description is made by way of the presently preferred and various alternative embodiments only and should not in any way be interpreted as self-limiting. To the extent various modifications may also have been considered, they are described.

DESCRIPTION OF THE PREFERRED EMBODIMENT

Figure 1:
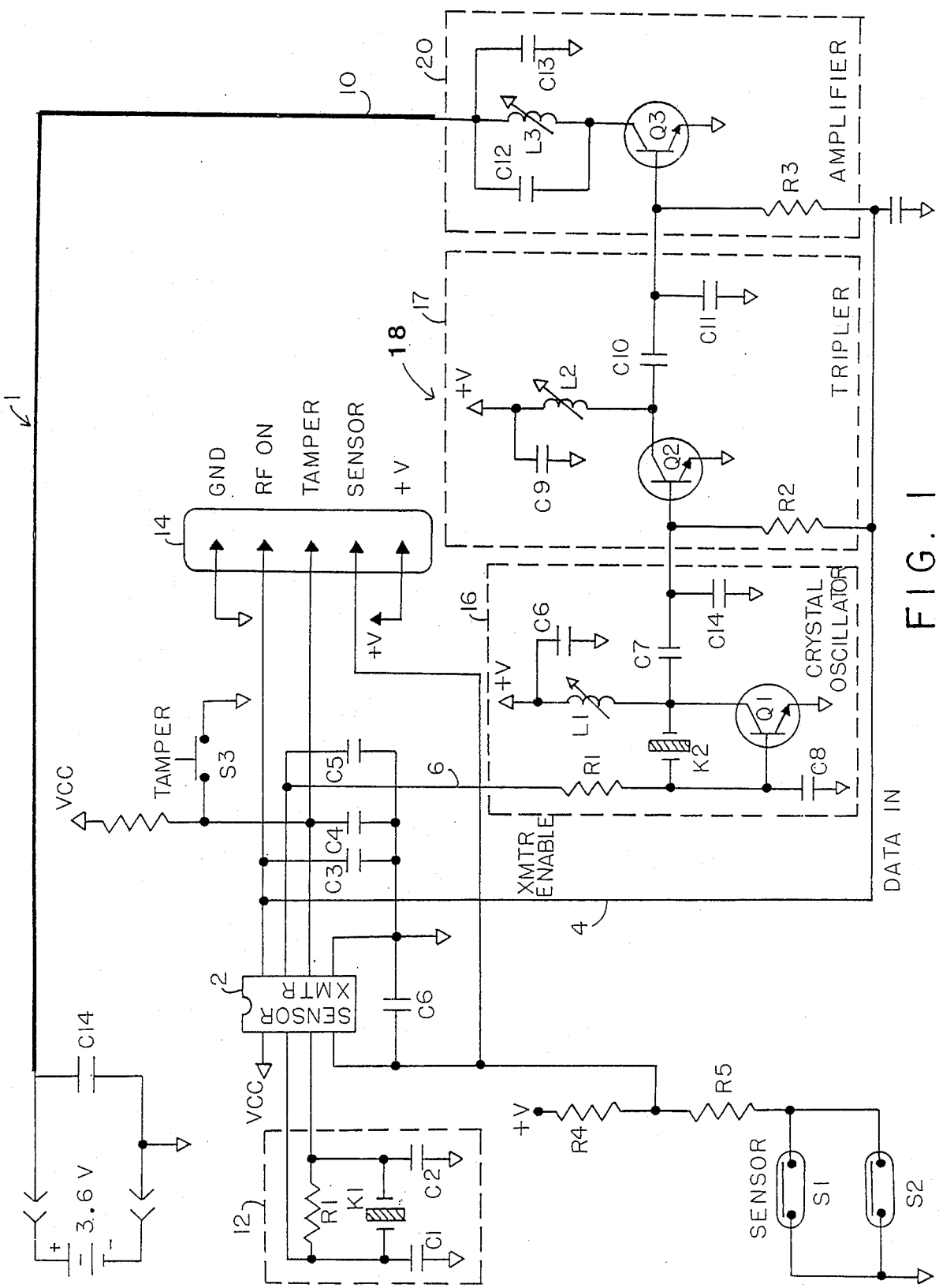
FIG. 1 shows a schematic diagram of a crystal controlled amplitude modulated RF transmitter including a tripler stage.

Turning attention to FIG. 1, a schematic diagram is shown of the present invention in relation to the integrated circuit sensor transmitter 2 of Applicant's U.S. Pat. No. 4,737,770 Because the circuitry and operation of the sensor transmitter 2 are discussed in detail in the co-pending application, they will not be discussed in any great detail herein.

Generally though, each sensor transmitter 2 comprises a programmable integrated circuit device which may be programmed with specific binary identification data descriptive of the security system and the particular transducer to which it is assigned. That is, along with identification data, each sensor transmitter 2 may be programmed with various preconditioning options peculiar to the specific transducer type to which it is coupled and relative to which the sensed inputs are processed to determine valid alarm (i.e. violation) and restore conditions. Upon the detection of either a violation or a restore signal, the sensor transmitter 2 produces a "data in" signal (i.e. a pulse position encoded binary message wherein each pulse of each data frame identifies two bits of binary data) on conductor 4, which along with a "transmitter enable" signal on conductor 6, causes the present crystal controlled transmitter 8 to transmit a corresponding amplitude modulated signal at 319.5 MHz to the system controller by way of the antenna 10.

As mentioned, it is desirous that the overall construction of the circuitry of FIG. 1 be as small as possible so that it is not detectable by an intruder. In particular, the sensor transmitter 2 and RF transmitter circuitry 8 are intended to be packaged into a container approximately 3 inches long and ½ inch in diameter. This size allows the package to be inserted into a drilled hole adjacent an associated magnet. Alternatively, somewhat larger, surface or recess mounted, packaging including a number of reed switches is contemplated.

Before directing attention to the details of the RF transmitter circuitry 8, it might be noted that coupled to the left side of the programmable sensor transmitter 2 is an attendant 32.768 Khz crystal clock 12. This clock produces the basic timing signals required by the sensor transmitter 2 as it produces its pulse position encoded messages.

Coupled to the right side is a program connector 14 which enables the system installer to physically couple a hand-held programming unit (not shown) to each of the sensor transmitters 2 as they are installed in relation to their associated transducer. Appropriate address and preconditioning data may thus be entered or changed at will.

Also coupled to the connector 14 and sensor transmitter 2 are two reed switches S1 and S2 which are mounted at right angles to one another to two sides of the circuit board containing the sensor transmitter 2 and RF transmitter 8. Each switch, along with an associated magnet, comprises one transducer which may be used for monitoring a door or window. This configuration is particularly advantageous in that it permits alternative mountings of the assembly and related magnet (not shown) in proximity to one of the switches S1 or S2 which, if interrupted, induces a change in switch state from open to closed and a violation transmission. Similarly, the re-opening of the affected switch causes a restore transmission. A tamper switch S3 coupled to the transmitter enclosure similarly induces a "tamper" transmission, if violated.

Turning attention now to the transmitter circuitry 8 of FIG. 1, it is essentially comprised of three stages which are serially coupled to one another and are responsive to the "transmit enable" and "data in" signals on conductors 4 and 6 to transmit a corresponding amplitude modulated RF message to the CPU. Specifically, these stages are a crystal oscillator stage 16, a tripler stage or multiplier 18 and an amplifier stage 20. The output of the transmitter 8, in turn, is coupled to the believed novel antenna which also couples power from a 3.6 volt battery source to the circuitry—the battery/antenna connection occurring at a battery clip integrally constructed as part of the antenna 10. The details of the antenna 10 will however be described hereinafter with respect to FIGS. 4 and 5.

Figure 2:
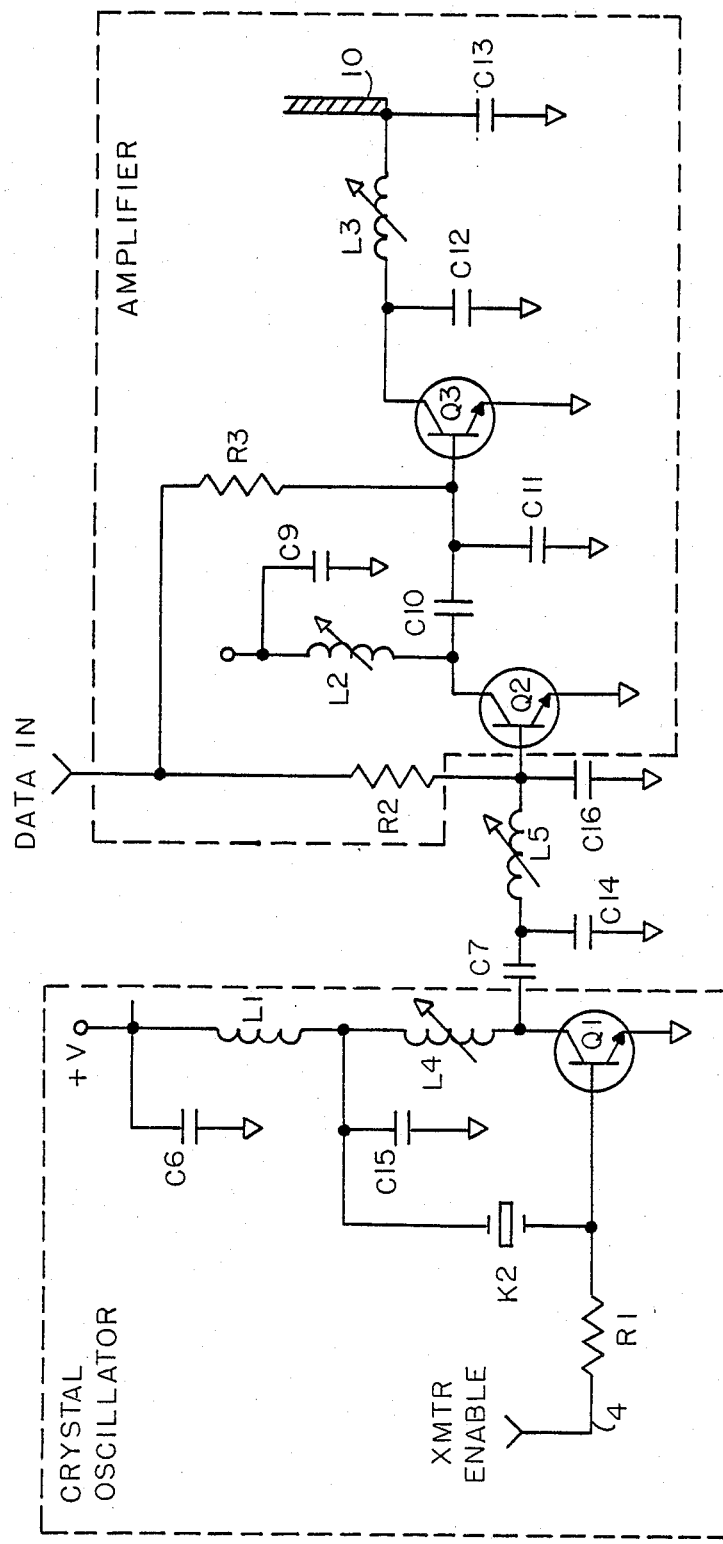
FIG. 2 shows a schematic diagram of an alternative RF transmitter including a fifth overtone crystal oscillator self-producing third harmonic.
Figure 3:
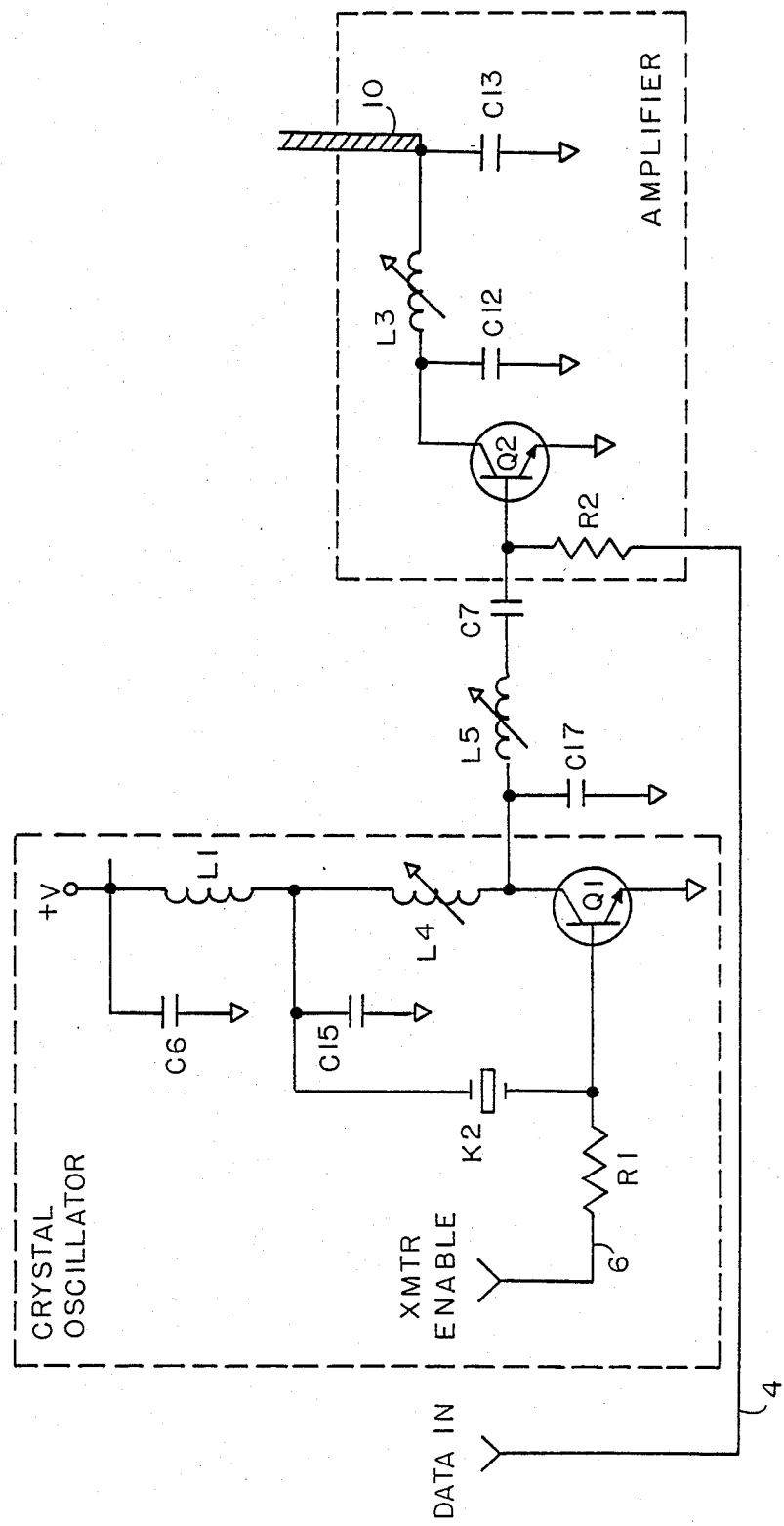
FIG. 3 shows a schematic diagram of an alternative RF transmitter including a frequency multiplying crystal oscillator of the type of FIG. 2 and a series resonant trap coupling the carrier frequency to the amplifier stage.

In combination and by way of general design parameters, the three stages 16, 18 and 20, as with the other transmitter circuits of FIGS. 2 and 3, and the antenna 10 are designed to provide a maximum signal field strength at 319.5 MHz while attenuating all other undesired frequencies and harmonics, although the circuit of FIG. 3 best accomplishes these goals. The circuits are also designed to provide a parts count accommodating of the foregoing packaging size concerns in a cost effective design from the standpoint of discrete part cost and overall assembly costs.

Referring first to the crystal oscillator stage 16, it generally comprises a fifth overtone producing, modified Pierce oscillator which oscillates at 106.5 MHz, although the crystal's K2 fundamental frequency is 21.3 MHz. Of the various circuit components, tunable inductor L1 (2½T) is set to promote resonance at the fifth overtone of the crystal's K2 fundamental frequency, while capacitor C6 (0.001 μf) serves as a bypass capacitor to the crystal's K2 fundamental frequency. Capacitor C8 (43 pf) is selected to provide the necessary phase shift for oscillation at the fifth overtone of the fundamental frequency (106.5 MHz) and to minimize a parasitic third harmonic of the fundamental frequency, while capacitors C7 (43 pf) and C14 (200 μf) couple the desired 106.5 MHz or fifth overtone output of the oscillator stage 16 to the tripler stage 18.

Like other crystal oscillators, the oscillator 16 requires a brief warmup period. Accordingly, the sensor transmitter 2, approximately 0.5 milliseconds before each message transmission, couples a transmit enable signal by way of conductor 6 to the oscillator 16 to induce oscillation.

Once the oscillator 16 is enabled, the sensor transmitter circuitry 2 couples its pulse position encoded data by way of conductor 4 and resistors R2 (100 k) and R3 (33 k) to the bases of transistors Q2 and Q3 (motorola mps-H10) of the respective tripler and amplifier stages 18 and 20. At the tripler stage 18, the 106.5 MHz frequency of the oscillator 16's output is converted and partially amplified to its third harmonic of 319.5 MHz. The resultant carrier signal is, in turn, amplified and amplitude modulated in correspondence with the pulse position encoded data at the amplifier stage 20 before it is transmitted by way of antenna 10.

That is, transistor Q2 of the tripler stage 18 is biased to operate in cutoff, since R2 is significantly larger than R3, to convert the 106.5 MHz input to the desired 319.5 MHz carrier frequency. Inductor L2 (1½T) filters the resultant carrier of any undesired fundamental frequency component and capacitor C9 (100 pf) bypasses undesired frequencies to ground. Capacitor C10 (8.2 pf) and C11 (33 pf), in turn, attenuate unwanted frequencies other than the desired 319.5 MHz carrier frequency which is coupled to the amplifier output stage 20, wherein transistor Q3 is biased by resistor R3 (33 K) to operate in it linear range and modulate the carrier with the encoded security data. data. Inductor L3 (1.5 T) and capacitor C12 (7.5 pf) couple the modulated carrier to antenna 10 and capacitor C13 (2 pf) further attenuates unwanted frequencies.

With continuing attention to FIG. 1 and further attention to FIG. 2, an alternative embodiment of the transmitter circuitry of FIG. 1 is disclosed. This circuit principally differs from that of FIG. 1 in that it does not require a separate tripler stage 18. Instead, the crystal oscillator stage 16 is modified to not only oscillate at the crystal's fifth overtone frequency of 106.5 MHz but also to enhance the desired third harmonic carrier frequency of 319.5 MHz and at which frequency inductor L4 (1.5 T) and capacitors C7 (1 pf) and C14 (0.2 pf) resonate. The carrier frequency is, in turn, coupled by way of the tuned pi coupling network comprised of capacitors C14 (0.2 pf) and C16 (22 pf) and inductor L5 (4.5 T), to a two transistor amplifier output stage 20 including transistors Q2 and Q3 (NEC3544). There, as before, the resultant 319.5 MHz carrier frequency is amplitude modulated with the encoded security data.

In constructing an improved oscillator to directly produce the desired third harmonic of the crystal's K2 fifth overtone, the circuit of FIG. 2 adds inductor L4 (1.5 T) and capacitor C15 (150 pf) into transistor Q1's feedback path to obtain the necessary phase shift for fifth overtone oscillation at 106.5 MHz and to present a relatively high Q1 base impedance, without capacitor C8, at the desired third harmonic of the fifth overtone frequency or 319.5 MHz to enhance this otherwise parasitic harmonic. Inductor L1 (2.5 T) and capacitor C6 (220 pf) continue to reject any 21.3 MHz fundamental frequency component. The pi coupling network, in turn, allows the extraction of the 319.5 MHz harmonic, without interfering with the oscillator's basic operation at 106.5 MHz. The pi coupling network also attenuates frequency components greater than the desired third harmonic carrier.

FIG. 3 discloses yet another alternative, and presently preferred embodiment, of the transmitter circuitry 8. It generally operates in the same fashion as that of FIG. 2, except in lieu of a pi coupling network, a series resonant trap comprised of capacitor C17 (7.5 pf) and inductor L5 (4.5 T) is used to trap and couple the desired third harmonic carrier to a single transistor amplifier stage including transistor Q2(NEC 3544). This circuit has also been found to meet the pertinent regulatory requirements, while also providing a reduced parts count to better meet the previously mentioned packaging and cost goals.

Once the 319.5 MHz carrier frequency is appropriately modulated, it is coupled to the antenna 10 which, from an operational standpoint, need merely comprise a sufficiently long conductor having enough surface area to ensure reasonably noise-free transmissions over the relative short, intended transmission distances of one thousand feet. Consequently, a bare wire may suffice. However, given the further necessity of coupling the antenna to the battery power source, and in lieu of a separate battery clip connector, the present invention further contemplates fabricating the required clip connector as part of the antenna. The antenna is thus constructed, for example, from beryllium or other suitably conductive/flexive materials.

In its preferred embodiment, the antenna 10 of FIGS. 2 and 3 is constructed from flat stock beryllium. Alternatively, it is to be appreciated that a solid conductor might be used with less cost, but which would also require a separate battery clip.

Figure 5:
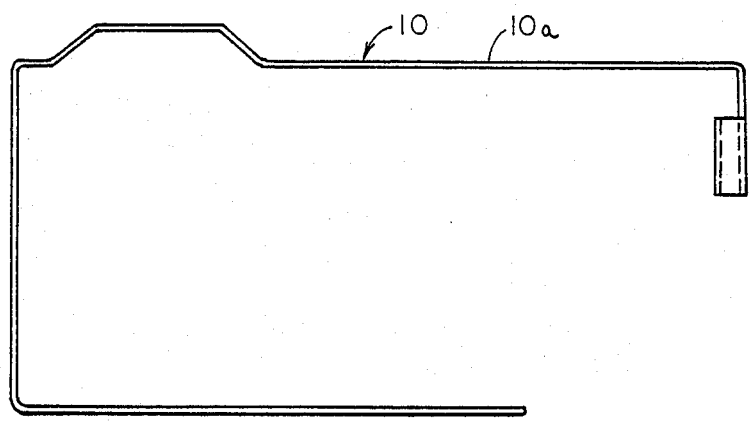
FIG. 5 shows a top view taken along reference lines 4—4 of FIG. 4.
Figure 4:
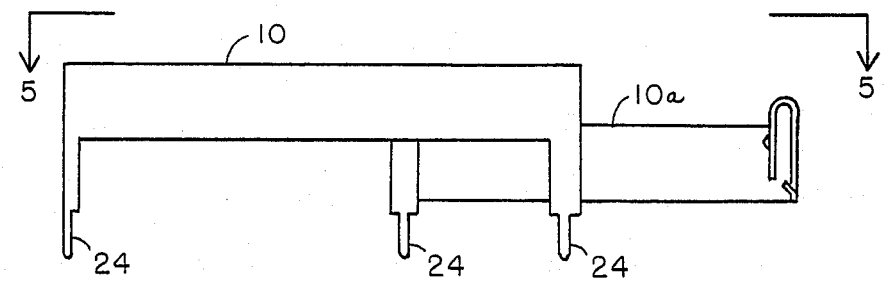
FIG. 4 shows a front view of the improved antenna used in conjunction with the present invention.

In this regard, attention is directed to FIGS. 4 and 5 and wherein a front view of the antenna is shown in FIG. 4 and a top view, taken along reference lines 5—5 of FIG. 4, is shown in FIG. 5. From FIG. 4, it is particularly to be noted that the one end of the antenna is constructed with a vertically disposed, inverted U-shaped portion that is brought into spring contact with the positive end of the 3.6 volt battery power supply. Thus, a battery holder or separate battery clips are not required and which, as mentioned, facilitates the reduction of overall package size and cost.

From FIG. 5, it is also to be appreciated that the battery is mounted in parallel relation to the horizontal portion 10a of the antenna 10. Similarly, the circuitry of FIG. 1 is mounted within the interior C-shaped area of the antenna 10, with the programming terminal 14 being mounted at the lower right open corner. Formed pin connectors 24 are also provided for solder mounting the antenna 10 to a printed circuit board (not shown).

A further advantage of the above surrounding construction is that the antenna 10 also acts to physically protect the circuit components from damage such as might typically be encountered at the installation site and/or during inventorying.

While described with respect to its presently preferred embodiment, it is to be appreciated that the present invention might be modified by those of skill in the art. It is accordingly contemplated that the following claims should be interpreted so as to include all those equivalent embodiments within the spirit and scope thereof.

What is claimed is:

1. A crystal controlled oscillator comprising:
   (a) a transistor having a base, emitter and collector;
   (b) a first tunable inductor coupled between said collector and one end of a second inductor, wherein an opposite end of said second inductor is coupled to a source potential and to a first capacitor and wherein an opposite end of said first capacitor is coupled to a ground potential;
   (c) a second capacitor and a crystal resonant at a fundamental frequency each having one end coupled to the junction between said first and second inductors and wherein the opposite end of said second capacitor is coupled to said ground potential and the opposite end of said crystal is coupled to said base and wherein said first inductor and second capacitor produce resonance at a fifth overtone frequency of said fundamental frequency; and
   (e) a third capacitor coupled between said collector and a load and wherein said second inductor and third capacitor resonate at and couple a third harmonic of said fifth overtone frequency to said load.

2. An oscillator comprising:
   (a) a transistor having a base, emitter and collector;
   (b) means for biasing said transistor to conduction;
   (c) a crystal resonant at a fundamental frequency coupled at one end to said base and at an opposite end to a junction between a first and a second inductor and means coupled to said first inductor to produce resonance at a fifth overtone of said fundamental frequency and to said second inductor to produce resonance at a predetermined parasitic harmonic of said fifth overtone frequency; and
   (d) means for coupling the predetermined harmonic frequency to a load.

3. Apparatus as set forth in claim 2 wherein said load coupling means comprises a series resonant network, resonant at a third harmonic of said fifth overtone frequency.

4. Apparatus as set forth in claim 2 wherein said load includes:
   (a) means for amplifying the predetermined harmonic frequency of said oscillator; and (b) an antenna coupled between said amplifier means and a storage battery.

5. Apparatus as set forth in claim 4 wherein said antenna is formed of a flexibly resilient conductive material and said end in contact with said storage battery is shaped to spring bias said antenna against a stationary battery contact.

6. Apparatus as set forth in claim 2 wherein said third harmonic coupling means comprises a series resonant network resonant at said third harmonic.

7. Apparatus as set forth in claim 2 including means for bypassing said fundamental frequency to a ground potential.

* * * * *